US006703687B2

United States Patent
Hahm

(10) Patent No.: US 6,703,687 B2
(45) Date of Patent: Mar. 9, 2004

(54) BIPOLAR TRANSISTOR AND METHOD FOR MANUFACTURING THE SAME

(75) Inventor: Hun Joo Hahm, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 2 days.

(21) Appl. No.: 10/141,113

(22) Filed: May 9, 2002

(65) Prior Publication Data

US 2003/0116822 A1 Jun. 26, 2003

(30) Foreign Application Priority Data

Dec. 20, 2001 (KR) ........................................ 2001-82103

(51) Int. Cl.[7] ...................... H01L 27/082; H01L 27/102; H01L 29/70; H01L 31/11
(52) U.S. Cl. ........................ 257/591; 257/592; 257/574; 257/565
(58) Field of Search ................................. 257/591, 592, 257/558, 574, 554, 564, 565, E29.03, E29.044

(56) References Cited

U.S. PATENT DOCUMENTS

| | | | | |
|---|---|---|---|---|
| 4,333,774 A | * | 6/1982 | Kamioka | 438/345 |
| 5,192,992 A | * | 3/1993 | Kim et al. | 257/370 |
| 5,244,533 A | * | 9/1993 | Kimura et al. | 438/368 |
| 5,751,053 A | * | 5/1998 | Honda | 257/592 |
| 5,872,391 A | * | 2/1999 | Lee et al. | 257/578 |
| 6,504,232 B2 | * | 1/2003 | Norstrom et al. | 257/587 |
| 2002/0063297 A1 | * | 5/2002 | Lee | 257/371 |

* cited by examiner

Primary Examiner—George Fourson
Assistant Examiner—Michelle Estrada
(74) Attorney, Agent, or Firm—Lowe Hauptman Gilman & Berner LLP

(57) ABSTRACT

A bipolar transistor and a method for manufacturing the bipolar transistor are provided. The bipolar transistor includes a collector region including a semiconductor substrate doped with a first conductive dopant, an intrinsic base region low-density doped with a second conductive dopant on the semiconductor substrate, the second conductive dopant being contrary to the first conductive dopant, an extrinsic base region high-density doped with the second conductive dopant on a first portion of the upper surface of the intrinsic base region and formed in a single well with at least two branched lower terminals, an emitter region doped with the first conductive dopant on a second portion of the upper surface of the intrinsic base region, the second portion spaced from the first portion by a designated interval, a collector electrode formed on the lower surface of the semiconductor substrate, an emitter electrode formed on the upper surface of the emitter region, and a base electrode formed on the upper surface of the extrinsic base region.

5 Claims, 5 Drawing Sheets

BIPOLAR TRANSISTOR AND METHOD FOR MANUFACTURING THE SAME

BACKGROUND OF THE INVENTION

1. Field of the Invention

The present invention relates to a bipolar transistor, more particularly to a bipolar transistor suitable for high-frequency and high-speed operation, in which its extrinsic base region has a twin well structure adapted to reduce base resistance. The present invention also relates to a method for manufacturing such a bipolar transistor.

2. Description of the Related Art

As well known to those skilled in the art, a bipolar transistor is generally a semiconductor device having two PN junctions between a base and collector and between a base and an emitter on a silicon substrate, so as to carry out switching and amplifying functions.

Among bipolar transistors, a high-frequency bipolar transistor requires high current gain and low base resistance to improve low noise characteristic. In order to achieve this goal, some approaches employ a base region comprising an intrinsic base region of low density and an extrinsic base region of high density and thin junction depth, which is formed on the intrinsic base region. With the aforementioned configuration, low noise characteristic at high-speed performance can be improved by obtaining high current gain through the intrinsic base region and supplying base current through the extrinsic base region.

FIG. 1a is a partial cross-sectional view of a conventional bipolar transistor. As shown in FIG. 1a, the conventional bipolar transistor of NPN type includes a collector region having a high-density N-type silicon substrate 11 and a low-density N-type epitaxial layer 12 formed on the silicon substrate 11, a base region having an intrinsic base region 15, which is low-density doped with P-type dopant, and an extrinsic base region 16, which is high-density doped with P-type dopant on the intrinsic base region 15, and an emitter region 18, which is doped with N-type dopant on the intrinsic base region 15. Although not shown in FIG. 1a, an oxidation layer is formed on the uppermost surface and partially opened to form an emitter electrode and a base electrode with poly silicon or metal. Additionally, a collector electrode is formed on the lower surface of the silicon substrate 11.

The conventional bipolar transistor of FIG. 1a operates in such a manner that when base current is supplied to the base electrode, amplified collector current in proportion with the amplification degree of the base current flows into the emitter region. Herein, it is preferable to increase the current gain, i.e., the ratio of the collector current to the base current. However, as represented by arrows in FIG. 1a, the base current flows into not only the emitter region but also the collector region through the intrinsic base region. Parts of the base current flowing into the base region increase the base resistance, thereby reducing the current gain.

The aforementioned problem occurs also in a bipolar transistor with an up-collector structure. FIG. 1b is a partial cross-sectional view of the conventional NPN-type bipolar transistor with an up-collector structure. As shown in FIG. 1b, the conventional NPN-type bipolar transistor includes a silicon substrate 21, a base region including an intrinsic base region 25, which is low-density doped with P-type dopant, and an extrinsic base region 26, which is high-density doped with P-type dopant, an emitter region 28, which is doped with N-type dopant on the intrinsic base region 25, and a high-density N-type collector region 22 formed on the intrinsic base region 25.

With this structure, parts of the collector current generated from the collector region 22 flow into the substrate 21, thereby reducing the collector current efficiency and increasing the collector resistance and inductance.

The current generated from the base region (or from the collector region of the up-collector structure) flows in an undesired direction and reduces the low-noise characteristic at high-frequency and high-speed performance and Va (early voltage) for modulating the base depth, thus hampering the performance of the bipolar transistor.

Therefore, a bipolar transistor with an innovative and novel structure to maximize the current gain is required so as to improve the performance at high-frequency and high-speed operation.

SUMMARY OF THE INVENTION

Therefore, the present invention has been made in view of the above problems, and it is an object of the present invention to provide a bipolar transistor having an improved performance at the high-frequency and high-speed operation by forming the base or the collector in a twin well structure so as to decrease the current flowing in an undesired direction.

It is another object of the present invention to provide a method for manufacturing a bipolar transistor to maximize the current gain.

In accordance with one aspect of the present invention, the above and other objects can be accomplished by the provision of a bipolar transistor comprising a collector region including a semiconductor substrate doped with a first conductive dopant, an intrinsic base region low-density doped with a second conductive dopant on the semiconductor substrate, the second conductive dopant being contrary to the first conductive dopant, an extrinsic base region high-density doped with the second conductive dopant on a first portion of the upper surface of the intrinsic base region and formed in a single well with at least two branched lower terminals, an emitter region doped with the first conductive dopant on a second portion of the upper surface of the intrinsic base region, the second portion spaced from the first portion by a designated interval, a collector electrode formed on the lower surface of the semiconductor substrate, an emitter electrode formed on the upper surface of the emitter region, and a base electrode formed on the upper surface of the extrinsic base region.

Preferably, the emitter region may be spaced from both sides of the extrinsic base region by a designated interval, and the single well of the extrinsic base region may be a twin well structure with lower terminals branched into the emitter region.

Further, preferably, the semiconductor substrate may include a substrate high-density doped with the first conductive dopant, and an epitaxial layer low-density doped with the first conductive dopant on the upper surface of the substrate.

In accordance with another aspect of the present invention, there is provided a bipolar transistor comprising a semiconductor substrate, an intrinsic base region low-density doped with a first conductive dopant on the upper surface of the semiconductor substrate, a collector region doped with a second conductive dopant on a first portion of the upper surface of the intrinsic base region and formed in a single well with at least two branched lower terminals, an extrinsic base region doped with the first conductive dopant on a second portion of the upper surface of the intrinsic base region and, the second portion spaced from the first portion by a designated interval, an emitter region doped with the second conductive dopant on a third portion of the upper surface of the intrinsic base region, the third portion spaced from the first portion and the second portion by a designated interval, a collector electrode formed on the upper surface of the collector region, an emitter electrode formed on the upper surface of the emitter region, and a base electrode formed on the upper surface of the extrinsic base region.

Preferably, the extrinsic base region may be spaced from both sides of the collector region by a designated interval, and the single well of the collector region is a twin well structure with lower terminals branched into the emitter region.

In accordance with yet another aspect of the present invention, there is provided a method for manufacturing a bipolar transistor. The bipolar transistor manufacturing method includes the steps of forming a semiconductor substrate doped with a first conductive dopant, forming an intrinsic base region low-density doped with a second conductive dopant on the semiconductor substrate, the second conductive dopant being contrary to the first conductive dopant, forming an extrinsic base region high-density doped with the second conductive dopant on a first portion of the upper surface of the intrinsic base region and formed in a single well with at least two branched lower terminals, forming an emitter region doped with the first conductive dopant on a second portion of the upper surface of the intrinsic base region, the second portion spaced from the first portion by a designated interval, and forming a collector electrode, an emitter electrode and a base electrode on the lower surface of the semiconductor substrate, the upper surface of the emitter region and the upper surface of the extrinsic base region, respectively.

Preferably, the step of forming the semiconductor substrate may include the sub-steps of forming a substrate high-density doped with the first conductive dopant, and forming an epitaxial layer low-density doped with the first conductive dopant on the upper surface of the substrate.

Further, preferably, the step of forming the extrinsic base region includes the sub-steps of forming two separated wells by being doped with the second conductive dopant using a mask provided with two separated openings corresponding two wells, and forming an extrinsic base region of a twin well structure by diffusing the two separated wells.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1A:
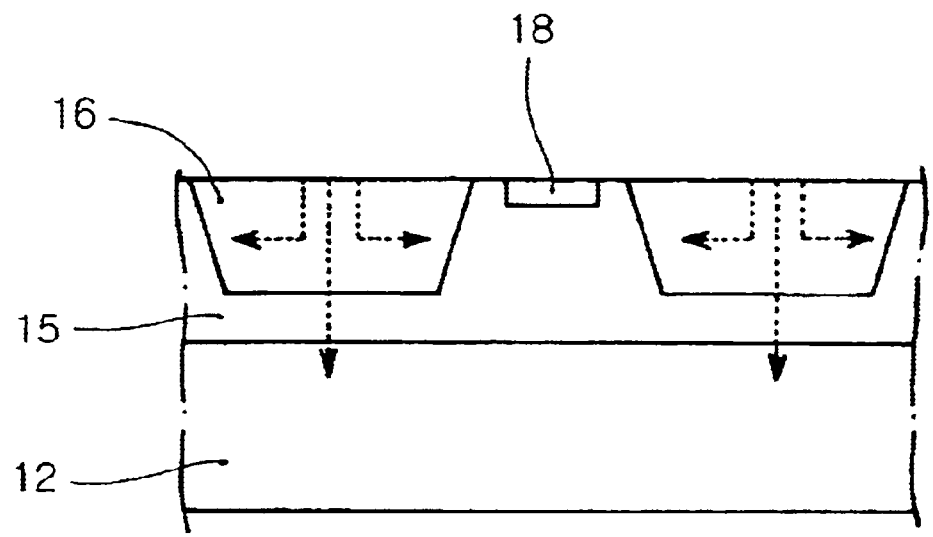
FIGS. 1a and 1b are partial cross-sectional views of a conventional bipolar transistor.
Figure 1B:
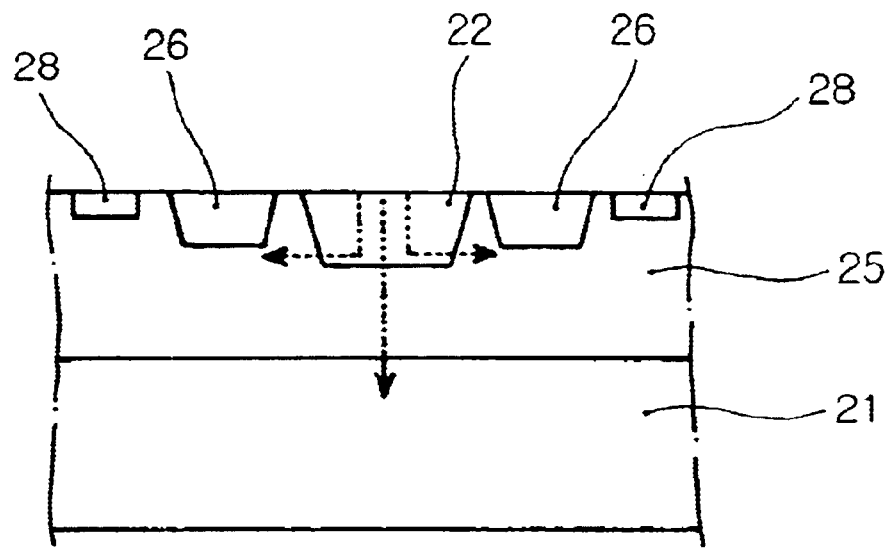
Figure 2:
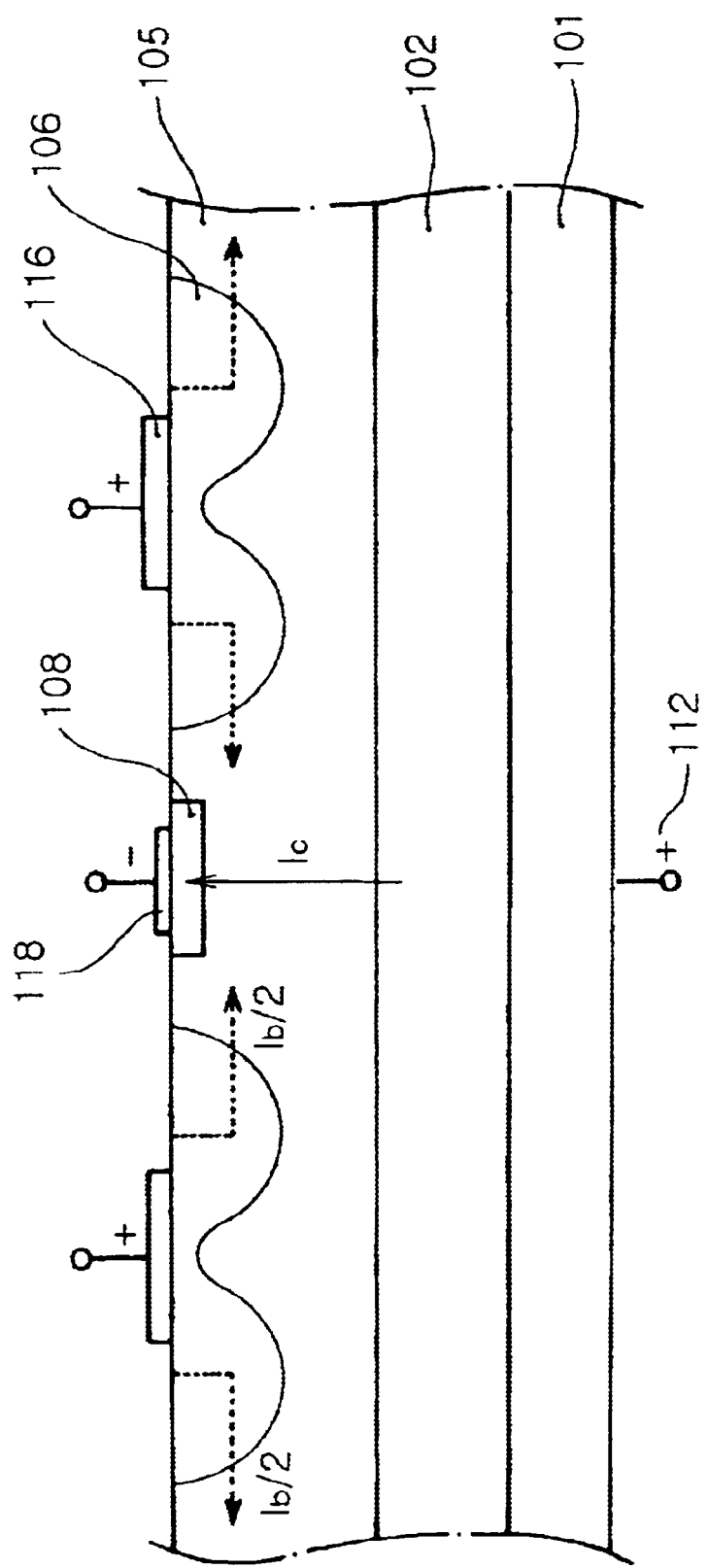
FIG. 2 is a partial cross-sectional view of a bipolar transistor in accordance with one aspect of the present invention.

FIG. 2 is a partial cross-sectional view schematically showing a bipolar transistor in accordance with one aspect of the present invention. The bipolar transistor of FIG. 2 includes a collector region, a base region and an emitter region.

The collector region includes a semiconductor substrate 101, which is high-density doped with first conductive dopant, and an epitaxial layer 102, which is high-density doped with first conductive dopant on the upper surface of the substrate 101. The base region includes an intrinsic base layer 105, which is low-density doped with second conductive dopant on the epitaxial layer 102, and an extrinsic base layer 106, which is high-density doped with second conductive dopant on a first portion of the intrinsic base region 105. The emitter region 108 is doped with a first conductive dopant on a second portion of the intrinsic base region 105.

Further, a collector electrode 112 is formed on the lower surface of the semiconductor substrate 101. An emitter electrode 118 is formed on the upper surface of the emitter region 108 and a base electrode 116 is formed on the upper surface of the extrinsic base electrode 106.

In this aspect of the present invention, the extrinsic base region 106 has a structure, in which two wells are interconnected to each other by diffusion step. Hereinafter, this structure is referred to as a "twin well". This twin well structure is of a single well, in which two wells are interconnected at the upper region but branched at the bottom region.

As shown in FIG. 2, the extrinsic base region 106 decreases the size of its lower region serving as a route of current flowing into the collector region 102 and the decreasing lower region of the extrinsic base region 106 is replaced with the high-resistance and low-density intrinsic base region 105. This high-resistance structure of the intrinsic base region 105 reduces current flowing into the collector region. On the other hand, current flowing into the emitter region normally flows along the high-density extrinsic base region 106. Moreover, the amount of current flowing into the emitter further increases due to the reduction of the amount of current flowing into the collector.

As described above, the extrinsic base region of the present invention is configured to have a twin well structure, thereby reducing the amount of current flowing into the collector, concentrating most of the base current on the emitter region formed on both sides of the extrinsic base region, thus increasing the base current efficiency. Subsequently, the bipolar transistor according to the present invention improves the low-noise characteristic at the high-frequency and high-speed performance by reducing the base resistance ($r_b$).

Figure 3:
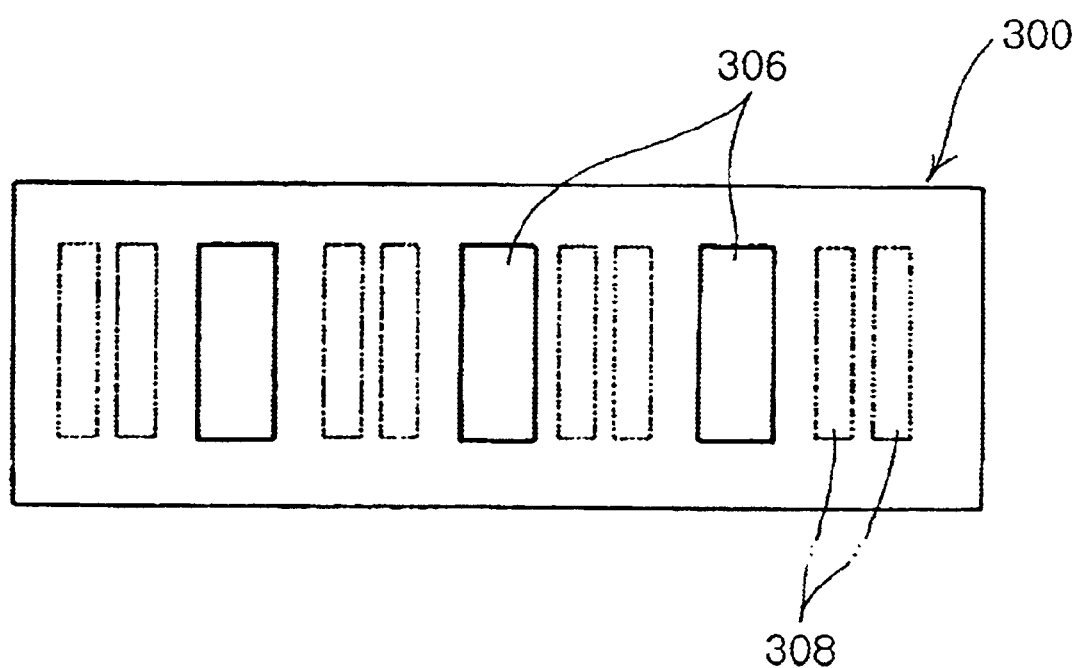
FIG. 3 is a schematic view of a mask employed in the present invention.

The present invention provides an extrinsic base region with a structure for maximizing the base current. FIG. 3 shows a mask for forming the extrinsic base region with the twin well structure.

Referring to FIG. 3, the mask 300 includes three openings 306 for emitters and three openings 308 for extrinsic base regions between the openings 306. Alternatively, a mask for ion implantation step may be used with openings for emitters and bases. The mask pattern for the openings depends on kinds of the products.

Figure 4A:
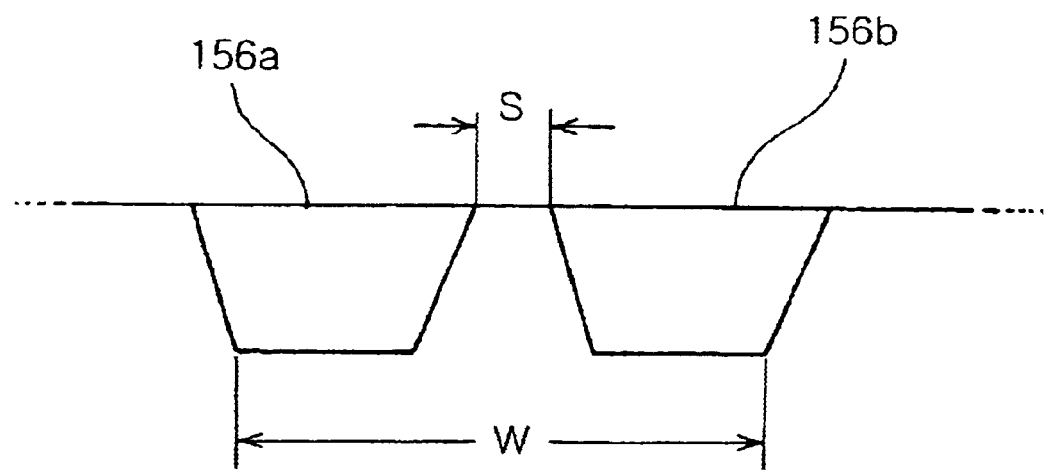
FIGS. 4a and 4b are partial cross-sectional views of an extrinsic base of the bipolar transistor of the present invention.
Figure 4B:
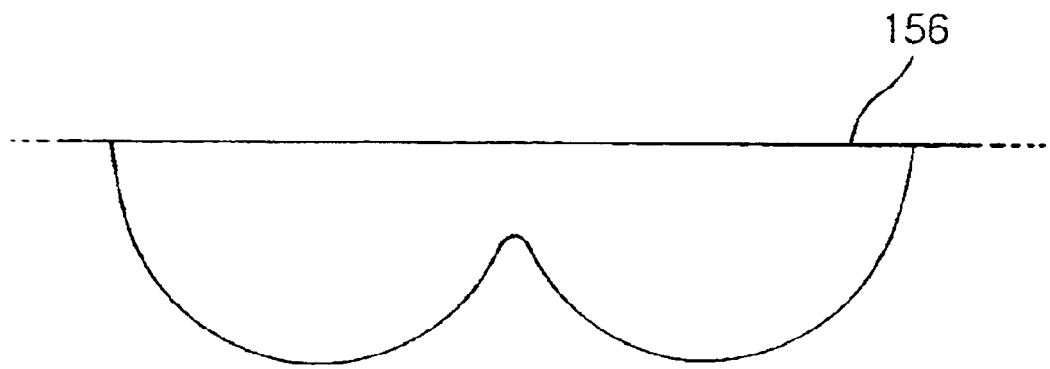

The mask 300 of FIG. 3 has the openings 308 for the extrinsic base regions between the openings 306 for the emitter. A set of the openings 308 for the extrinsic base regions consists of two fully separated regions. A dopant region of FIG. 4a is formed by the ion implantation process using the aforementioned openings 308. The dopant region includes two separated wells 156a, 156b. Then, under the diffusion process, as shown in FIG. 4b, the dopant regions of two wells 156a, 156b extend, are connected and form the twin well structure, in which upper regions of two separated wells 156a, 156b are interconnected. That is, an extrinsic base region 156 with a single well having two branched lower terminals is formed.

The current gain effect of the extrinsic base region according to the present invention is described hereinafter. In order to effectively comply with the standard of the extrinsic base region, a rate of branch of the extrinsic base region is defined based on a disposition of two wells fully separated prior to the diffusion process. Herein, the term "rate of branch" refers to a degree of separating two wells of the extrinsic base region prior to the diffusion process, on the assumption that the extrinsic base region is completed under the same diffusion condition.

Referring to FIG. 4a, the rate of branch (a) of the extrinsic base region is a space (s) between two wells 156a and 156b if total width (w) of the twin well is 1. As the rate of branch increases, the twin well structure of the present invention is more closely achieved. The twin well employed in the present invention will be described with examples more specifically hereafter.

Three bipolar transistors in accordance with the present invention were manufactured, respectively with the rate of branch of 0.1, 0.2, and 0.4. Then, the bipolar transistors were diffused under the same condition, thereby forming a single extrinsic base region branched into two terminals at the bottom. Each rate of increase of the resistance into the collectors of three bipolar transistors was measured. Herein, the rate of increase of resistance is a rate of increase of the resistance into the collector relative to the resistance between the conventional extrinsic base region and the collector in a bipolar transistor, which was produced under the same condition as the above described bipolar transistor of the present invention but includes the conventional extrinsic base region.

As the rate of increase of resistance increases, the base current flowing into the collector decreases and the base current flowing into the emitter increase, thereby heightening the current gain and reducing the base resistance.

Table 1 shows the characteristics of the bipolar transistor structure and the increasing rate of resistance against the base current flowing into the collector according to the above evaluation result.

TABLE 1

| Rate of branch of the extrinsic base region (a) | Rate of increase of resistance (%) |
| --- | --- |
| 0.1 | 11 |
| 0.2 | 25 |
| 0.4 | 67 |

As represented in Table 1, the more the branching rate of the extrinsic base region, the higher the resistance value to the current flowing into the collector. Particularly, in the case where the rate of branch is the highest, i.e., 0.4, the resistance value to the base current flowing into the collector increased by 67% as compared to the conventional bipolar transistor. Therefore, in the bipolar transistor of the present invention, since the base current mostly flows into the emitter region, the current gain increases and the base resistance decreases, thereby resulting in high performance at the high-frequency and high-speed operation.

Furthermore, the present invention is applicable to various types of bipolar transistors, particularly to a bipolar transistor with an up-collector structure differing from the structure of FIG. 2.

Figure 5:
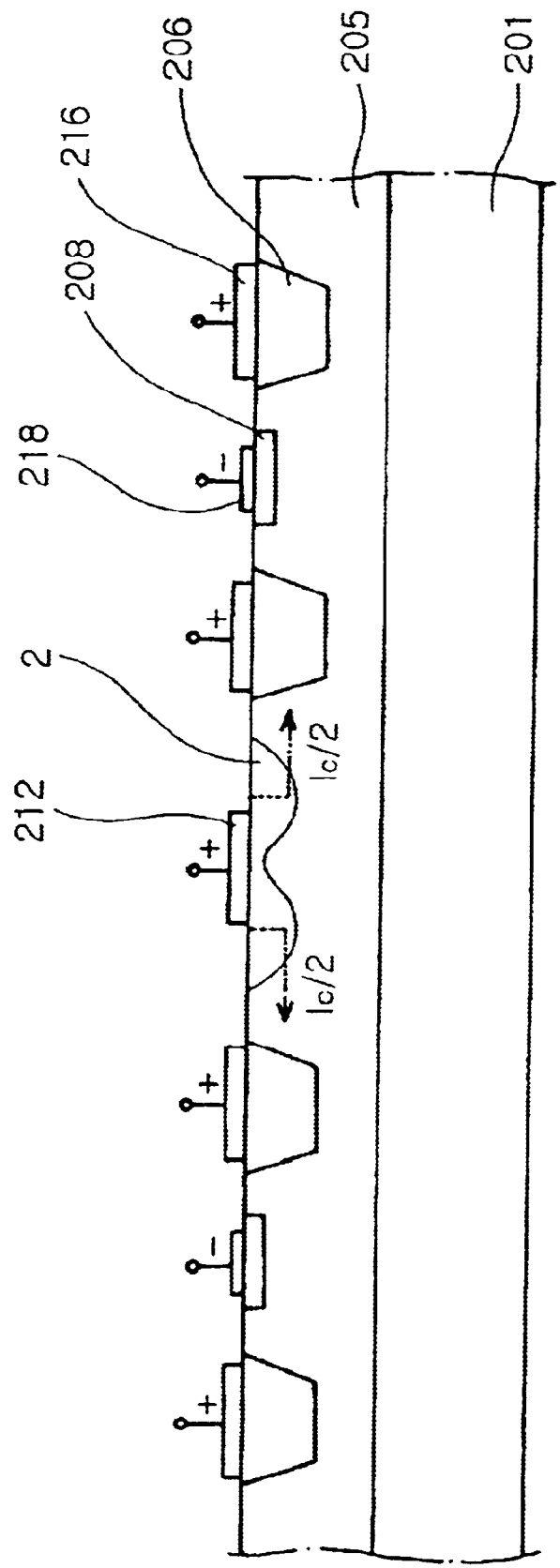
FIG. 5 is a partial cross-sectional view of a bipolar transistor in accordance with another aspect of the present invention.

FIG. 5 is a partial cross-sectional view of an up-collector bipolar transistor in accordance with another aspect of the present invention. The bipolar transistor of FIG. 5 includes an intrinsic base layer 205, which is low-density doped with first conductive dopant on a semiconductor substrate 201, a collector region 202, which is doped with second conductive dopant on a portion of the intrinsic base region 205, and a extrinsic base region 206, which is doped with first conductive dopant on another portion of the intrinsic base region 205. An emitter region 208 is doped with second conductive dopant on further another portion of the intrinsic base region 205. Further, a collector electrode 212, an emitter electrode 218 and a base electrode 216 are respectively formed on the collector region 202, the emitter region 208 and the extrinsic base region 206.

The up-collector structure in FIG. 5 does not cause the aforementioned problem in the base current efficiency but causes a problem in the collector current efficiency. That is, parts of collector current flow into the semiconductor substrate 201 and the collector current amount flowing into the extrinsic region 206 decreases, finally reducing the collector current efficiency. In order to overcome this problem, a branched twin well structure is configured on both sides of the collector region 202. This twin well structure provides high resistance on a route from the collector region 202 to the substrate 201, thereby most of the collector current flows along the high-density and low-resistance collector region 202 into the extrinsic base region 216. In the same manner as that of FIG. 2, the collector current efficiency increases and the collector resistance decreases, thereby resulting in high performance at the high-frequency and high-speed operation.

As apparent from the above description, the present invention provides a bipolar transistor, which is configured to form the extrinsic base region (or the collector) in a twin well structure so as to reduce the current undesirably flowing into the downside and improve the efficiency of the current flowing into the emitter on both sides (or into the extrinsic base region in the up-collector structure), thereby greatly improving the performance at the high-frequency and high-speed operation.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A bipolar transistor comprising:
  a collector region including a semiconductor substrate doped with a first conductive dopant;
  an intrinsic base region low-density doped with a second conductive dopant on said semiconductor substrate, said second conductive dopant being contrary to said first conductive dopant;
  an extrinsic base region high-density doped with said second conductive dopant on a first portion of the upper surface of said intrinsic base region and formed in a single well with at least two branched lower terminals;

an emitter region doped with said first conductive dopant on a second portion of the upper surface of said intrinsic base region, said second portion spaced from said first portion by a designated interval;

a collector electrode formed on the lower surface of said semiconductor substrate;

an emitter electrode formed on the upper surface of said emitter region; and a base electrode formed on the upper surface of said extrinsic base region.

2. The bipolar transistor as set forth in claim 1, wherein said emitter region is spaced from both sides of said extrinsic base region by a designated interval, and said single well of said extrinsic base region is a twin well structure with lower terminals branched into said emitter region.

3. The bipolar transistor as set forth in claim 1, wherein said semiconductor substrate comprises a substrate high-density doped with said first conductive dopant, and an epitaxial layer low-density doped with said first conductive dopant on the upper surface of said substrate.

4. A bipolar transistor comprising:

a semiconductor substrate;

an intrinsic base region low-density doped with a first conductive dopant on the upper surface of said semiconductor substrate;

a collector region doped with a second conductive dopant on a first portion of the upper surface of said intrinsic base region and formed in a single well with at least two branched lower terminals;

an extrinsic base region doped with said first conductive dopant on a second portion of the upper surface of said intrinsic base region and, said second portion spaced from said first portion by a designated interval;

an emitter region doped with said second conductive dopant on a third portion of the upper surface of said intrinsic base region, said third portion spaced from said first portion and said second portion by a designated interval;

a collector electrode formed on the upper surface of said collector region;

an emitter electrode formed on the upper surface of said emitter region; and a base electrode formed on the upper surface of said extrinsic base region.

5. The bipolar transistor as set forth in claim 4, wherein said extrinsic base region is spaced from both sides of said collector region by a designated interval, and said single well of said collector region is a twin well structure with lower terminals branched into said emitter region.

* * * * *